(12) United States Patent
Manens et al.

(10) Patent No.: US 6,884,153 B2
(45) Date of Patent: Apr. 26, 2005

(54) APPARATUS FOR ELECTROCHEMICAL PROCESSING

(75) Inventors: Antoine P. Manens, Palo Alto, CA (US); Paul D. Butterfield, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/445,239

(22) Filed: May 23, 2003

(65) Prior Publication Data

US 2003/0220053 A1 Nov. 27, 2003

Related U.S. Application Data

(63) Continuation-in-part of application No. 10/211,626, filed on Aug. 2, 2002, which is a continuation-in-part of application No. 10/033,732, filed on Dec. 27, 2001, which is a continuation-in-part of application No. 09/505,899, filed on Feb. 17, 2000, now Pat. No. 6,537,144.

(51) Int. Cl.$^7$ .......................... B24B 1/00; H01L 21/302
(52) U.S. Cl. ............................ 451/41; 451/54; 451/65; 438/692
(58) Field of Search ................. 451/41, 54, 65, 451/67, 259, 285–289, 411, 526–539; 438/690–693

(56) References Cited

U.S. PATENT DOCUMENTS

| | | | |
|---|---|---|---|
| 4,713,149 A | 12/1987 | Hoshino | 204/23 |
| 6,033,293 A | 3/2000 | Crevasse et al. | 451/494 |
| 6,183,354 B1 | 2/2001 | Zuniga et al. | 451/285 |
| 6,261,168 B1 | 7/2001 | Jensen et al. | 451/527 |
| 6,261,959 B1 | 7/2001 | Travis et al. | 438/692 |
| 6,328,642 B1 | 12/2001 | Pant et al. | 451/307 |
| 6,331,135 B1 | 12/2001 | Sabde et al. | 451/41 |
| 6,368,184 B1 | 4/2002 | Beckage | |
| 6,402,591 B1 | 6/2002 | Thornton | 451/36 |
| 6,406,363 B1 | 6/2002 | Xu et al. | 451/296 |
| 6,428,394 B1 | 8/2002 | Mooring et al. | 451/41 |
| 6,431,968 B1 | 8/2002 | Chen et al. | 451/398 |
| 6,435,948 B1 | 8/2002 | Molnar | 451/41 |
| 6,475,332 B1 | 11/2002 | Boyd et al. | 156/345.12 |
| 6,482,307 B1 | 11/2002 | Ashjaee et al. | 205/103 |
| 6,497,800 B1 | 12/2002 | Talieh et al. | 204/224 R |
| 6,517,426 B1 | 2/2003 | Lee | |
| 6,520,843 B1 | 2/2003 | Halley | 451/285 |
| 6,551,179 B1 | 4/2003 | Halley | 451/285 |
| 6,561,889 B1 | 5/2003 | Xu et al. | 451/526 |
| 6,569,004 B1 | 5/2003 | Pham | 451/526 |
| 6,572,463 B1 | 6/2003 | Xu et al. | 451/526 |
| 6,585,579 B1 | 7/2003 | Jensen et al. | 451/527 |
| 2001/0005667 A1 | 6/2001 | Tolles et al. | |
| 2001/0036746 A1 | 11/2001 | Sato et al. | |
| 2002/0020621 A1 | 2/2002 | Uzoh et al. | |
| 2002/0119286 A1 | 8/2002 | Chen et al. | |
| 2002/0123300 A1 | 9/2002 | Jones et al. | 451/41 |
| 2003/0019577 A1 | 1/2003 | Brown | 156/345.14 |

FOREIGN PATENT DOCUMENTS

| | | |
|---|---|---|
| EP | 0 325 753 A2 | 8/1989 |
| WO | WO 01/71066 A1 | 9/2001 |
| WO | WO 02/075804 A2 | 9/2002 |

*Primary Examiner*—David B. Thomas
(74) *Attorney, Agent, or Firm*—Moser, Patterson & Sheridan

(57) ABSTRACT

A method and apparatus for electrically biasing a substrate in an electrochemical processing system is generally provided. In one embodiment, an apparatus for electrochemical processing includes a polishing pad and a conductive element disposed therein. The polishing pad has an upper surface adapted to support a substrate thereon during processing. The conductive element disposed in the polishing pad is movable between a first position having at least a portion of the conductive element exposed above the upper surface and a second position below the upper surface, wherein the conductive element is magnetically biased towards the first position.

37 Claims, 5 Drawing Sheets

US 6,884,153 B2

APPARATUS FOR ELECTROCHEMICAL PROCESSING

This application is a continuation-in-part of co-pending U.S. application Ser. No. 10/211,626, filed Aug. 2, 2002, which is a continuation-in-part of co-pending U.S. patent application Ser. No. 10/033,732, filed Dec. 27, 2001, which is a continuation-in-part of U.S. patent application Ser. No. 09/505,899, filed Feb. 17, 2000 now U.S. Pat. No. 6,537,144.

BACKGROUND OF THE INVENTION

1. Field of the Invention

Embodiments of the present invention generally relate to a method and apparatus for electrically biasing a substrate in an electrochemical processing system.

2. Description of the Related Art

Electrochemical Mechanical Polishing (ECMP) is a technique used to remove conductive materials from a substrate surface by electrochemical dissolution while concurrently polishing the substrate with reduced mechanical abrasion compared to conventional Chemical Mechanical Polishing (CMP) processes. The electrochemical dissolution is performed by applying a bias between a cathode and a substrate surface to remove conductive materials from the substrate surface into a surrounding electrolyte. Typically, the bias is applied to the substrate surface by a conductive polishing pad on which the substrate is processed. A mechanical component of the polishing process is performed by providing relative motion between the substrate and the conductive polishing pad which enhances the removal of the conductive material from the substrate.

During the ECMP process, conductive elements disposed in the conductive pad must maintain contact with the conductive layer of the substrate in order to achieve good processing results. If the conductive elements intermittently contact the conductive layer, the power source providing an electrical bias through the conductive elements may be damaged. Moreover, intermittent contact may result in current spikes as contact is made that may damage both the materials disposed on the substrate and the conductive elements themselves. Additionally, current spikes through the conductive elements may degrade the conductive properties at the surface of the conductive elements, thereby limiting and causing non-uniform current flow through the conductive element, resulting in unsatisfactory processing results.

To maintain good electrical contact between the conductive elements and the substrates, the conductive elements may be biased against the substrate by springs or electrolyte fluid flow. However, it is difficult to control the spring force applied to the conductive elements, and excessive spring force may lead to substrate scratching. Additionally, biasing the conductive elements using electrolyte flow may result in excessive quantities of electrolyte being utilized in order to achieve a desired bias force.

Thus, there is a need for an improved method and apparatus for electrically biasing a substrate in an electrochemical processing system.

SUMMARY OF THE INVENTION

A method and apparatus for electrically biasing a substrate in an electrochemical processing system is generally provided. In one embodiment, an apparatus for electrochemical processing includes a polishing pad and a conductive element disposed therein. The polishing pad has an upper surface adapted to support a substrate thereon during processing. The conductive element disposed in the polishing pad is movable between a first position having at least a portion of the conductive element exposed above the upper surface and a second position below the upper surface, wherein the conductive element is magnetically biased towards the first position.

In another aspect of the invention, a method for removing conductive material from a substrate is provided. In one embodiment, a method for removing conductive material from a substrate includes the steps of retaining a substrate in a polishing head against a polishing surface, magnetically urging a conductive element against the substrate, and electrically biasing the conductive element.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Embodiments of the invention generally relate to a method and apparatus for electrically biasing a substrate in an electrochemical processing system. In one embodiment, a contact element is magnetically biased against a conductive layer of a substrate being electrochemically processed to ensure good electrical contact during processing.

Figure 1:
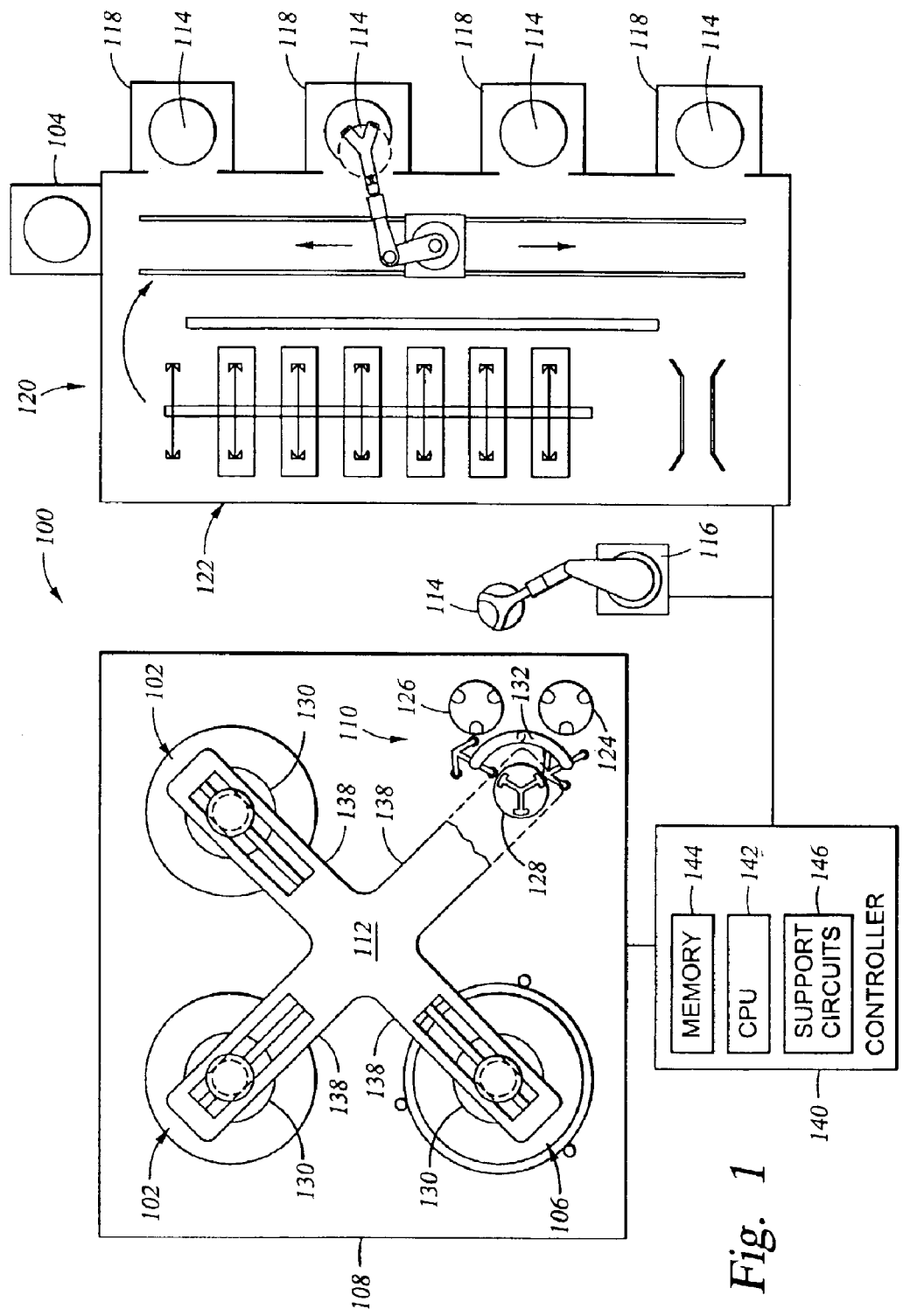
FIG. 1 is a plan view of one embodiment of a processing apparatus of the invention.

FIG. 1 depicts an electrochemical processing apparatus 100 having at least one electrochemical mechanical polishing (ECMP) station 102. Optionally, as depicted in the embodiment shown in FIG. 1, the system 100 may include at least one conventional polishing station 106 disposed adjacent the ECMP station 102 on a single platform or tool. One polishing tool that may be adapted to benefit from the invention is a REFLEXION® chemical mechanical polisher available from Applied Materials, Inc. located in Santa Clara, Calif. Examples of other polishing tools that may be adapted to benefit from the invention are MIRRA® and MIRRA MESA™ chemical mechanical polishers also available from Applied Materials, Inc.

The exemplary apparatus 100 generally includes a base 108 that supports the one or more ECMP stations 102, the one or more polishing stations 106, a transfer station 110 and a carousel 112. A loading robot 116 generally facilitates transfer of substrates 114 to and from the transfer station 110 of the apparatus 100 and a factory interface 120. The factory interface 120 may include a cleaning module 122, a metrology device 104 and one or more substrate storage cassettes 118. One example of a metrology device 104 that may be utilized in the factory interface 120 is a NovaScan™ Integrated Thickness Monitoring system, available from Nova Measuring Instruments, Inc., located in Phoenix, Ariz.

In one embodiment, the transfer station 110 includes an input buffer station 124, an output buffer station 126, a transfer robot 132, and a load cup assembly 128. The input buffer station 124 accepts substrates from the factory interface 120 by the loading robot 116. The loading robot 116 is also utilized to return polished substrates from the output buffer station 126 to the factory interface 120. The transfer robot 132 is utilized to move substrates between the buffer stations 124, 126 and the load cup assembly 128.

In one embodiment, the transfer robot 128 includes two gripper assemblies, each having pneumatic gripper fingers that hold the substrate 114 by the substrate's edge. The transfer robot 132 may simultaneously transfer a substrate to be processed from the input buffer station 124 to the load cup assembly 128 while transferring a processed substrate from the load cup assembly 128 to the output buffer station 126.

The carousel 112 has a plurality of arms 138, each respectively supporting one of a plurality of polishing heads 130. Each polishing head 130 retains one substrate 114 during processing. Substrates are loaded and unloaded from the polishing heads 130 by the load cup assembly 128. One of the arms 138 depicted in FIG. 1 is not shown so that the transfer station 110 may be seen. The carousel 112 moves the polishing heads 130 between the load cup assembly 128 of the transfer station 110, the one or more ECMP stations 102 and the one or more polishing stations 106. One carousel 112 that may be adapted to benefit from the invention is generally described in U.S. Pat. No. 5,804,507, issued Sep. 8, 1998 to Tolles et al., which is hereby incorporated by reference in its entirety. It is contemplated that other transfer mechanisms may be utilized to move substrates between the stations 102, 104 and the transfer station 110.

The polishing head 130 retains the substrate 114 against the ECMP station 102 or polishing station 106 during processing. Examples of embodiments of polishing heads 130 that may be adapted to benefit from the invention are described in U.S. Pat. No. 6,183,354, issued Feb. 6, 2001 to Zuniga, et al. Other polishing heads that may be adapted benefit from the invention include TITAN HEAD™ and TITAN PROFILER™ wafer carriers, available from Applied Materials, Inc. The arrangement of the ECMP stations 106 and polishing stations 102 on the apparatus 100 allows for the substrate 114 to be sequentially polished by moving the substrate between stations while being retained in the same polishing head 130. Alternatively, substrates may be polished in other sequences.

To facilitate control of the polishing apparatus 100 and processes performed thereon, a controller 140 comprising a central processing unit (CPU) 142, memory 144, and support circuits 146 is connected to the polishing apparatus 100. The CPU 142 may be one of any form of computer processor that can be used in an industrial setting for controlling various drives and pressures. The memory 144 is connected to the CPU 142. The memory 144, or computer-readable medium, may be one or more of readily available memories such as random access memory (RAM), read only memory (ROM), floppy disk, hard disk, or any other form of digital storage, local or remote. The support circuits 146 are connected to the CPU 142 for supporting the processor in a conventional manner. These circuits include cache, power supplies, clock circuits, input/output circuitry, subsystems, and the like.

Figure 2:
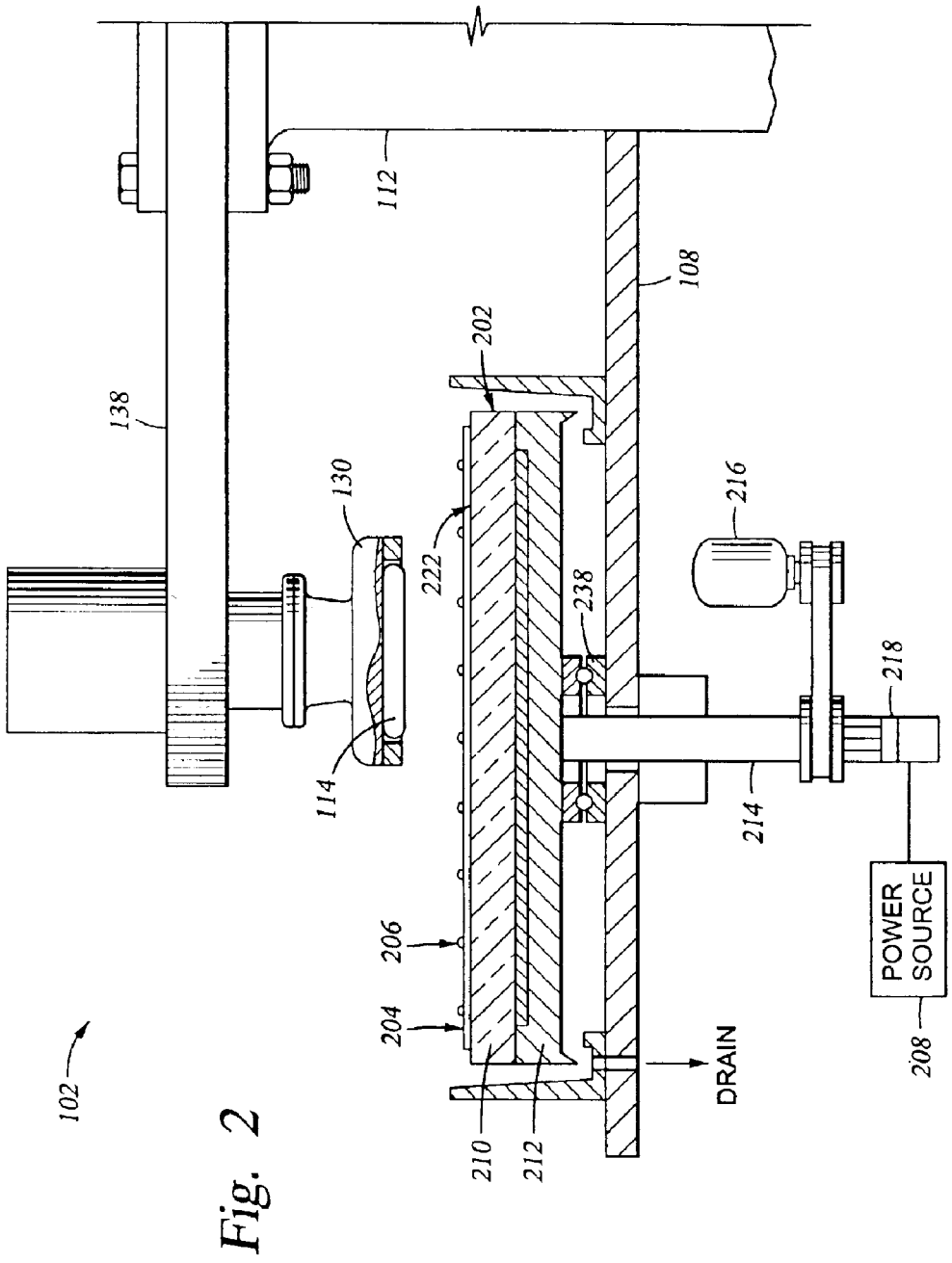
FIG. 2 is a sectional view of one embodiment of an ECMP station.

FIG. 2 depicts one embodiment of the ECMP station 102. The ECMP station 102 generally includes a platen 202 that supports a conductive polishing pad assembly 204. The conductive polishing pad assembly 204 includes a plurality of conductive elements 206 coupled to a power source 208. The conductive elements 206 are adapted to contact and electrically bias the substrate 114 held there against by the polishing head 130 during processing. As further described below, the conductive elements 206 are magnetically biased against the substrate 114 by a magnetic element, disposed in at least one of the polishing head 130 or platen 202.

In the embodiment depicted in FIG. 2, the platen 202 includes an upper body 210 and a lower body 212. The lower body 212 of the platen 202 may be fabricated from aluminum or other structural material. The lower body 212 is coupled by a shaft 214 to a drive system 216 disposed below the base 108. The drive system 216 is adapted to rotate the platen 202 during processing. A slip ring 218 is coupled to the shaft 214 to facilitate power connection between the power source 208 and the conductive pad assembly 204 while the platen 202 is rotating.

In one embodiment, the upper body 210 of the platen 202 may be comprised of an electrically insulative material, for example, a rigid plastic such as CPVC among others. Other rigid materials compatible with processing chemistries may alternatively be utilized, including conductive materials having an insulative layer (not shown) disposed between the upper body 210 of the platen 202 and the conductive pad assembly 204.

An upper surface 220 of the upper body 210 supports the conductive pad assembly 204 thereon. The conductive pad assembly 204 may be coupled to the upper surface 220 by adhesives, clamps, vacuum or other devices or methods suitable of securing the conductive pad assembly 204 to the platen 202 during processing while enabling periodic replacement of the pad assembly.

Figure 3:
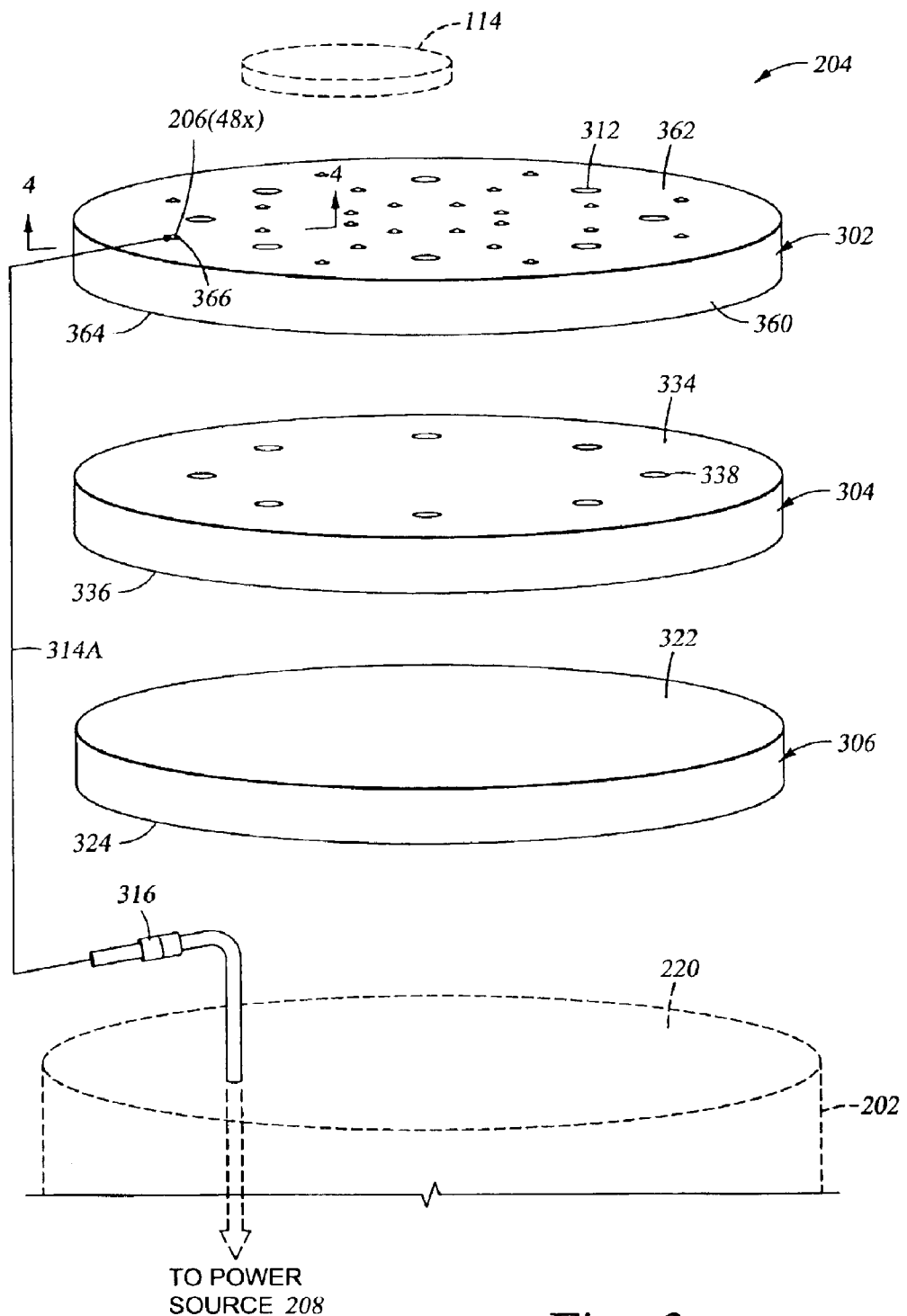
FIG. 3 is an exploded perspective view of one embodiment of a polishing pad assembly.

FIG. 3 is an exploded view of one embodiment of the conductive pad assembly 204. The conductive pad assembly 204 includes a conductive pad 302 and an electrode 306 sandwiching a subpad 304. The conductive pad 302, the subpad 304 and the electrode 306 may be secured together to form a unitary body that facilitates removal and replacement of the conductive pad assembly 204 from the platen 202. The conductive pad 302, the subpad 304 and the electrode 306 may be adhered, compression molded, bonded, clamped or otherwise fastened to one another. In the embodiment depicted in FIG. 3, the conductive pad 302, the subpad 304 and the electrode 306 are permanently bonded together using adhesives. Alternatively, the conductive pad 302, the subpad 304 and the electrode 306 may be coupled by other methods or combination thereof, including sewing, binding, heat staking, riveting, screwing and clamping among others.

The conductive pad 302 includes pad body 360 having the conductive elements 206 disposed therein. The conductive elements 206 are coupled by lead 314A to the power source 208 and are adapted to contact the surface of the substrate that is disposed on the pad body 360 during processing. The lead 314A may by coupled to the conductive elements 206 in any number of methods that facilitate good electrical connection between the conductive elements 206 and the power source 208, for example, by soldering, stacking, brazing, clamping, crimping, riveting, fastening, conductive adhesive or by other methods or devices that facilitate good electrical connection between the lead 314A and the conductive elements 206. A detailed description of methods for coupling the conductive elements 206 to the power source 208, along with examples of conductive pads that may be adapted to benefit from the invention, are described in U.S. patent application Ser. No. 10/211,262, filed Aug. 2, 2002, which is incorporated herein by reference in its entirety.

The pad body 360 may be a dielectric or conductive material. In one embodiment, the pad body 360 is fabricated from a polymeric material compatible with process chemistry, examples of which include polyurethane, polycarbonate, fluoropolymers, PTFE, PTFA, polyphenylene sulfide (PPS), or combinations thereof, and other polishing materials used in polishing substrate surfaces. The pad body 360 may also contain fillers and/or be foamed. Exemplary conventional material includes those made from polyurethane and/or polyurethane mixed with fillers, such as those commercially available from Rodel, Inc., located in Newark, Del. Other conventional polishing materials, such as a layer of compressible material, may also be utilized for the pad body 360. Compressible materials include, but are not limited to, soft materials such as compressed felt fibers leached with urethane or foam. The pad body 360 is generally between about 10 to about 100 mils thick.

Alternatively, the pad body 360 may be fabricated from a fully conductive material, such as a conductive material disposed in a polymer binder, or a conductive layer disposed over a conductive or non-conductive sublayer. Examples of examples of conductive pad bodies that may be adapted to benefit from the invention are described in the U.S. patent application Ser. No. 10/140,010, filed May 7, 2002, which is hereby incorporated by reference in its entirety.

The pad body 360 has a first side 362 and a second side 364. The first side 362 is adapted to contact the substrate 114 (shown in phantom in FIG. 3) during processing. The first side 362 may include grooves, embossing or other texturing to promote polishing performance. The pad body 360 may be solid, impermeable to electrolyte, permeable to electrolyte or perforated. The first side 308 additionally includes one or more apertures 366 or other features in which the conductive elements 206 are disposed. In the embodiment depicted in FIG. 3, the pad body 360 is perforated with a plurality of holes 312 adapted to allow flow of electrolyte therethrough and a plurality of apertures 366 having the conductive elements 206 disposed therein.

The subpad 304 is coupled to the second side 364 of the pad body 360. The subpad 304 is typically fabricated from a material softer, or more compliant, than the material of the pad body 360. The difference in hardness or durometer between the pad body 360 and the subpad 304 may be chosen to produce a desired polishing/plating performance. The subpad 304 may also be compressive. Examples of suitable backing materials include, but are not limited to, foamed polymers, elastomers, felt, impregnated felt and plastics compatible with the polishing chemistries.

The subpad 304 has a first side 334 and a second side 336. The first side 334 is coupled to the second side 364 of the pad body 360. The subpad 304 typically has a thickness in the range of about 5 to about 100 mils, and in one embodiment, is about 5 mils thick. The subpad 304 may be solid, impermeable to electrolyte, permeable to electrolyte or perforated. In one embodiment depicted in FIG. 3, the subpad 304 is configured to allow electrolyte therethrough, and may be permeable, have holes formed therethrough or a combination thereof. In the embodiment depicted in FIG. 3, the subpad 304 is perforated with a plurality of apertures 338 adapted to allow flow of electrolyte therethrough. The apertures 338 of the subpad 304 typically, but not necessarily, align with the holes 312 of the pad body 360.

The electrode 306 may be comprised of an electrically conductive material, such as stainless steel, platinum, copper, aluminum, gold, silver, tungsten and other conductive materials. The electrode 306 may range in thickness from foils to greater than 100 mils thick. The electrode 306 has a first side 322 and a second side 324. The first side 322 of the electrode 306 is coupled to the second side 336 of the subpad 304. The electrode 306 may be solid, impermeable to electrolyte, permeable to electrolyte or perforated. In the embodiment depicted in FIG. 3, the electrode 306 is configured to allow electrolyte therethrough.

The second side 324 of the electrode 306 is disposed on the upper surface 220 of the platen 202. The second side 324 of the electrode 306 is coupled by lead 314B that is typically routed with lead 314B (that is coupled to the pad body 360) through the platen 202 to the power source 208 (as shown in FIG. 2). The lead 314B may by coupled to the second side 324 in any number of methods that facilitate good electrical connection. Optionally, the leads 314A-B may be coupled to the power source 208 using a single disconnect 316, typically disposed in the platen 202, to further facilitate removal of the conductive pad assembly 204.

The second side 324 of the electrode 306 may be adhered to the upper surface 220 of the platen 202 with a removable adhesive to prevent the conductive pad assembly 204 from moving during polishing while allowing the conductive pad assembly 204 to be replaced. The conductive pad assembly 204 may alternatively be clamped, fastened or secured to the platen 202 by other methods.

The conductive elements 206 may be fabricated from conductive polymers, polymer composites with conductive materials, conductive metals or polymers, conductive fillers, graphitic materials, or conductive doping materials, or combinations thereof. The conductive elements 206 generally have a bulk resistivity or a bulk surface resistivity of about 10 $\Omega$-cm or less, and may comprise metals, such as gold, platinum and titanium, iridium and rhodium, or other conductive materials such as graphite as long as the chosen material is compatible with process chemistries. With regard to conductive materials, the contact elements may be solid or plated. For example, the conductive element 206 may be fabricated from a flexible material coated with a conductor. In one embodiment, the conductive element 206 is glass filled polyamide/polyimide coated with a noble metal such as gold.

Figure 4:
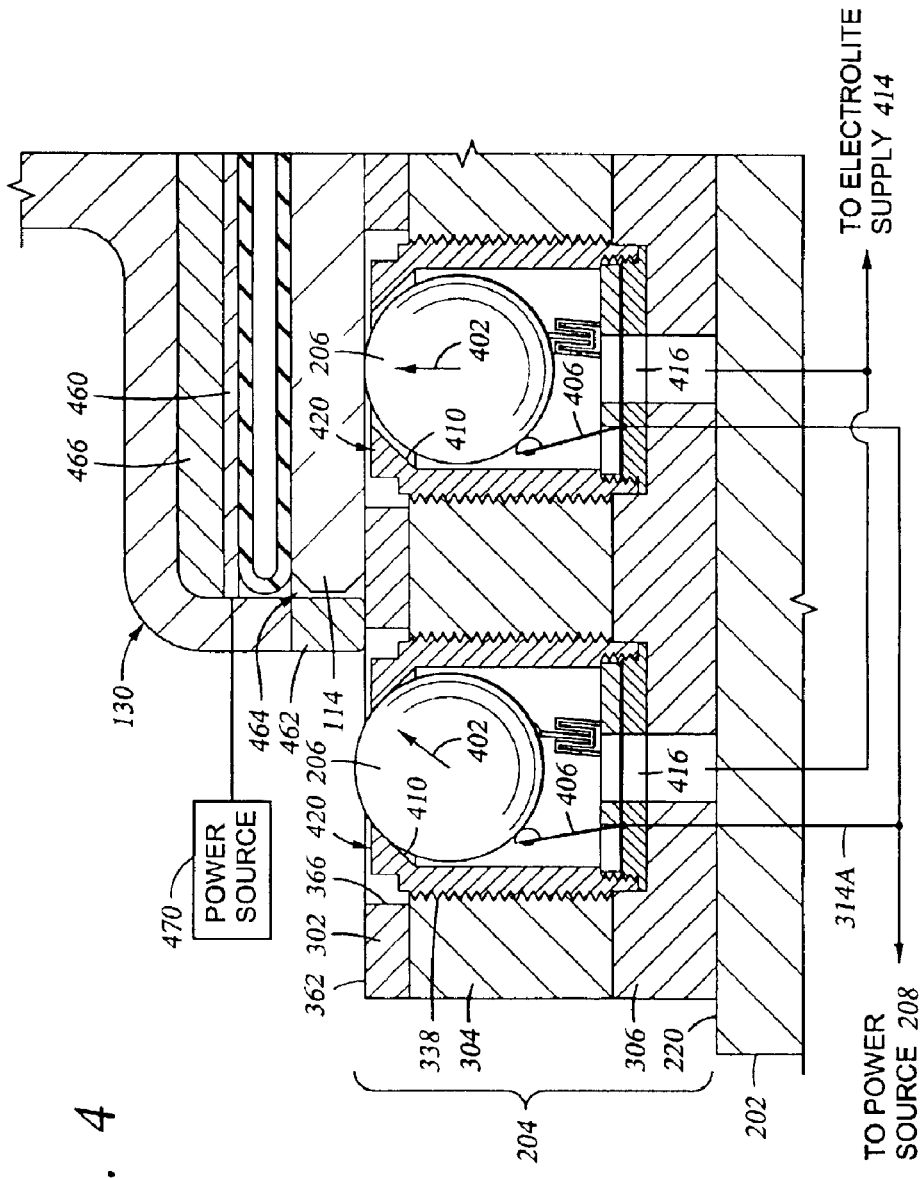
FIG. 4 is a partial sectional view of the ECMP station of FIG. 2.

FIG. 4 depicts a partial sectional view of the conductive pad assembly 204 through two of the conductive elements 206. The conductive elements 206 are movable normal to the upper surface 362 of the pad body 360, and have first positions where a portion of the outer surface of the conductive elements 206 are extend through or at least coplanar with the upper surface 362 so that the outer surface of the conductive element 206 may be in contact with the substrate 114 during processing. During processing, current (generated by the power supply 208) is flowed through the at least an electrically conductive outer surface of the conductive element 206 to the substrate 114. In the illustrative embodiment, the current is communicated from the power supply 208 by the lead 314A to the conductive element 206 via contact elements 406 (two of three equally spaced contact elements are shown in FIG. 4, but any number is contemplated). The contact elements 406 may be fabricated from an electrically conductive material compatible with process chemistries, such as noble metals, for example, gold.

In one embodiment, the contact elements 406 are elongated rods or spring forms spaced sufficiently far enough apart from one another to allow positioning of the conductive element 206 therebetween. The contact elements 406 are configured to maintain good electrical contact with the conductive element 206.

In the embodiment depicted in FIG. 4, the conductive elements 206 are a plurality of electrically conductive rollers. Alternatively, the geometry of the conductive elements 206 may be cylindrical, ellipsoidal, spherical, conical or frustoconical, among other shapes that will rotate while in contact with the substrate during processing.

A housing 420 is disposed in each of the apertures 366 of the pad body 360 and respectively accommodates one of the conductive elements 206. The housing 420 is generally a hollow cylindrical member configured to accommodate the conductive element 206. The housing 420 is substantially disposed below the upper surface 362 of the conductive pad assembly 204. In one embodiment, the housing 420 includes a threaded outer surface 424 is disposed through the aperture 366 of the pad body 360 and engages the subpad 304 to secure the housing 420 to the conductive pad assembly 204. The housing 420 is generally fabricated from a material that facilitates rotation and vertical movement of the conductive element 206, such as DELRIN® or other suitable plastics.

The normal (e.g., vertical) movement of the conductive element 206 within the housing 420 is restricted at the upper surface 220 of the conductive pad assembly 204 by an annular seat 410. The seat 410 has a diameter smaller than the diameter of the conductive element 206, but allows a portion of the conductive element's perimeter (shown as a ball) to extend above the upper surface 220 of the conductive pad assembly 204 so that the conductive element 206 may contact the substrate 114 during processing. In one embodiment, the seat 410 has a tapered inner surface.

In the embodiment depicted in FIG. 4, the polishing head 130 includes a magnetic element 460 adapted to bias the conductive elements 206 toward the extended position. The polishing head 130 also includes a retaining ring 462 circumscribing a carrier plate 466 to define a substrate receiving pocket 464. A bladder 468 may be disposed in the substrate receiving pocket 464 adjacent the carrier plate 466. As the substrate is transferred to the polishing head 130, the bladder 468 is evacuated to form a vacuum between the bladder and substrate, thereby retaining the substrate within the substrate receiving pocket 464.

The magnetic element 460 is magnetically coupled to the conductive elements 206. The magnetic attraction between the magnetic element 460 and conductive elements 206 pulls the conductive elements 206 against the seat 410 to the housing 420 such that the conductive elements 206 extend through the upper surface 220 of the conductive pad assembly 204. As the substrate 114 moves over the respective conductive elements 206 during processing, the conductive elements 206 are displaced by the substrate 114 to an elevation substantially equal to the plane of the upper surface 220 against the force of the conductive element 206, thereby ensuring good electrical contact between the substrate and conductive element 206.

The magnet element 460 is generally disposed parallel to the upper surface 220 of the conductive pad assembly 204. This orientation generally enhances force uniformity of the conductive elements 206 against the substrate 114.

In one embodiment, the magnetic element 460 is an electromagnet disposed between a carrier plate 466 of the polishing head 130 and the bladder 462. The magnetic element 460 is coupled to a power source 470 that may be selectively energized to apply a bias force attracting the conductive elements 206 to the polishing head 130. As the magnetic force applied by the magnetic element 460 is easily regulated by the power source 470, the contact force between the conductive elements 460 and the substrate 114 may be optimally tailored for specific processing routines. Moreover, as the bias force of the conductive elements 206 against the substrate 114 is decoupled for electrolyte flow conditions, the electrolyte delivery may be advantageously adjusted independent of the bias force between the conductive elements 460 and the substrate 114. In another embodiment, the magnetic element 460 may be a permanent magnet.

It is contemplated that the magnetic element 460 may be disposed in other positions within or adjacent the polishing head 130. It is also contemplated that polishing heads of other designs may be adapted to incorporate the magnetic element 460 to provide an attractive force on conductive elements 206 disposed in a conductive pad assembly 204.

Returning to the description of the housing 420, the end of the housing 420 opposite the seat 410 is open to allow the contact element 406 to extend into the housing 420 and contact the conductive element 206. The end of the housing 420 having the contact element 406 disposed therein also forms a fluid port 416. through the seat 410 for providing electrolyte fluid is provided through the fluid port 416 and passes through the housing 420 and out the seat 410 to contact the substrate during processing. The fluid port 416 is coupled by passages (not shown) formed in the platen 202 to an electrolyte supply 414.

The electrolyte supply 414 typically includes the electrolyte source and a pump (both not shown). The electrolyte may include commercially available electrolytes. For example, in copper containing material removal, the electrolyte may include sulfuric acid, sulfuric acid salt based electrolytes or phosphoric acid, phosphoric acid salt based electrolytes, such as potassium phosphate ($K_3PO_4$), ($NH_4$) $H_2PO_4$, ($NH_4$)$_2HPO_4$, or combinations thereof. The electrolyte may also contain derivatives of sulfuric acid based electrolytes, such as copper sulfate, and derivatives of phosphoric acid based electrolytes, such as copper phosphate. Electrolytes having perchloric acid-acetic acid solutions and derivatives thereof may also be used.

In operation, the polishing head 130 retains the substrate 114 against the upper surface 362 of the conductive pad assembly 204. A magnetic attraction is established between the conductive elements 206 and the magnetic element 460 disposed in the polishing head 130. The magnetic attraction may be due to the magnetic element 460 being a permanent magnet, or be the result of power applied to the magnetic element 460 in the form of an electromagnet.

The magnetic attraction between the conductive elements 206 and the magnetic element 460 causes the conductive elements 206 to move upwards, exposing a portion of the conductive elements 206 through the upper source 220 of the conductive pad assembly 204. The magnetic bias upwards results in the conductive elements 206 maintaining good contact force against the substrate 114 regardless of electrolyte flow attributes or other process conditions, thereby enhancing processing.

Power is applied to the conductive elements 206 by the power source 208, thereby electrically biasing the substrate relative to the electrode 306. Electrolyte is provided through the conductive pad assembly 204 to the substrate 114. The electrolyte provides a current path between the biased portion of the substrate (i.e., the conductive layer disposed on the substrate that is in contact with the conductive elements 206) and the electrode 306. Relative motion provided between the substrate 114 and conductive pad assembly 204 enhances removal of oxides formed on the conductive material, thereby maximizing the exposure of the conductive layer of the substrate to the electrochemical dissolution process.

Figure 5:
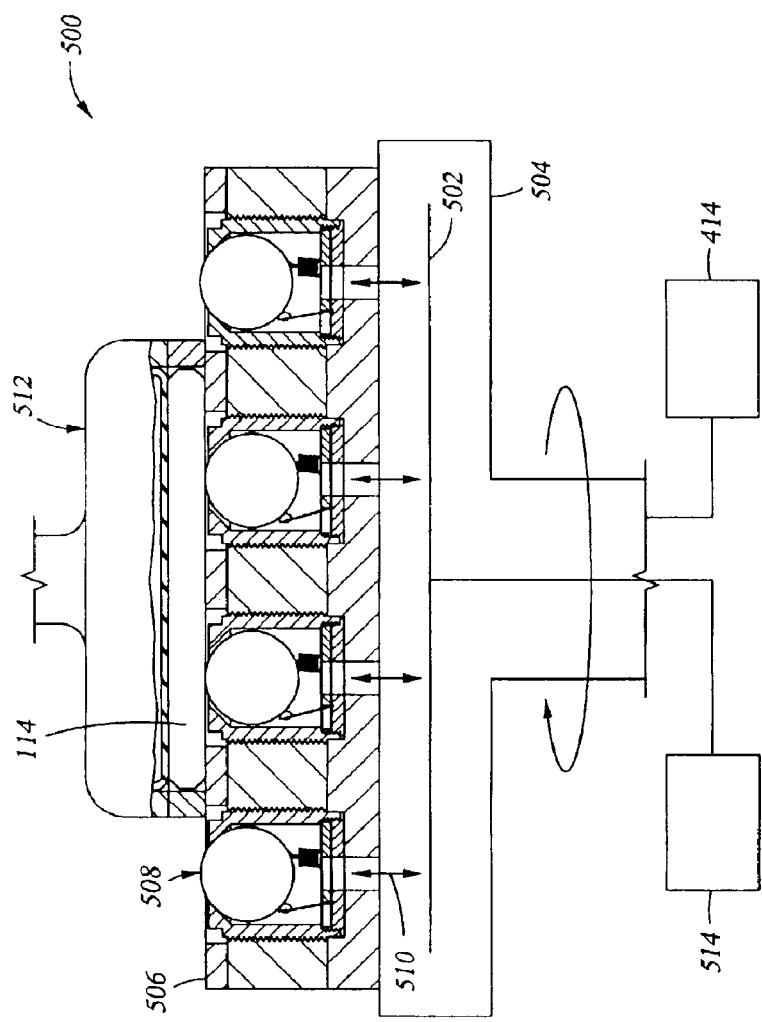
FIG. 5 is a simplified partial sectional view of another embodiment of an ECMP station.

FIG. 5 is a simplified sectional view of another embodiment of an ECMP station 500. The ECMP station 500 is similar to the ECMP station 102 described above, except that a magnetic element 502 of the station 500 is disposed in a platen 504 supporting a conductive pad assembly 506.

Conductive elements 508 disposed in the conductive pad assembly 506 are similar to the conductive elements described above, except that the conductive elements 508 are at least partially fabricated from a permanent magnetic material.

In one embodiment, the magnetic element 502 disposed in the platen 504 is an electromagnet. The magnetic element 502 may be selectively energized by a power source 514 to a polarity opposite that of the conductive elements 508, thereby repelling the conductive elements 508 (as shown by arrows 510) away from the magnetic element 502 and towards a substrate 114 retained by a polishing head 512 retained on the pad assembly 506 during processing.

Thus, embodiments of a method and apparatus for electrically biasing a substrate in an electrochemical processing system have been provided. In one embodiment, a conductive element is magnetically biased against a conductive layer of a substrate being electrochemically processed to ensure good electrical contact during processing. Moreover, the bias force of the contact element ensures good and repeatable electrical contact over a wide range of process and substrate surface conditions.

While the foregoing is directed to embodiments of the present invention, other and further embodiments of the invention may be devised without departing from the basic scope thereof, and the scope thereof is determined by the claims that follow.

What is claimed is:

1. A polishing apparatus, comprising:
    a polishing surface;
    a plurality of conductive elements movably disposed through the polishing surface; and
    a polishing head adapted to retain a substrate against the polishing surface while processing, wherein the polishing head and the conductive elements are magnetically coupled.

2. The apparatus of claim 1, wherein the polishing heed further comprises:
    a magnetic element.

3. The apparatus of claim 2, wherein the magnetic element comprises:
    a permanent magnet.

4. The apparatus of claim 2, wherein the magnetic element comprises:
    an electromagnet.

5. The apparatus of claim 2, wherein the magnetic element has an orientation planar to the polishing surface.

6. The apparatus of claim 1, wherein the conductive elements are at least partially fabricated from a permanent magnet.

7. The apparatus of claim 1, wherein the conductive elements are coated with a conductive material.

8. The apparatus of claim 1, wherein at least one of the conductive elements is a ball.

9. The apparatus of claim 8, wherein the ball is movable between a first position and a second position, wherein a perimeter of the ball is disposed at least partially above the polishing surface when in the first position, and disposed below the polishing surface when in the second position.

10. A polishing apparatus, comprising:
    a polishing pad having an upper surface adapted to support a substrate thereon during processing; and
    a conductive element disposed in the polishing pad and movable between a first position having at least a portion of the conductive element exposed above the upper surface and a second position below the upper surface, wherein the conductive element is magnetically biased towards the first position.

11. The polishing apparatus of claim 10, wherein the conductive element further comprises a plurality of rollers.

12. The polishing apparatus of wherein claim 10, further comprising:
    a polishing head disposed above the polishing pad;
    a platen supporting the polishing pad; and
    a magnetic element disposed in at least one of the polishing head or the platen.

13. The polishing apparatus of claim 12, wherein th magnetic element is an electromagnet.

14. The polishing apparatus of claim 12, wherein the magnetic element is an permanent magnet.

15. A polishing apparatus, comprising:
    a polishing surface;
    a platen supporting the polishing surface;
    at least one conductive element movable between a first position below the polishing surface and a second position at least partially exposed above the polishing surface; and
    a magnetic element magnetically coupled to the conductive element, wherein the magnetic element urges the conductive element between at least one of the first and second positions.

16. The apparatus of claim 15, further comprising:
    a polishing head adapted to retain a substrate against the polishing surface during processing, wherein the magnetic element is disposed in the polishing head.

17. The apparatus of claim 16, wherein the magnetic element further comprises:
    an electromagnet.

18. The apparatus of claim 16, wherein the magnetic element further comprises:
    a permanent magnet.

19. The apparatus of claim 15, wherein the magnetic element is disposed in the platen and is adapted to repel the conductive element.

20. The apparatus of claim 19, wherein the magnetic element is an electromagnet.

21. A method for removing conductive material from a substrate, comprising:
    retaining a substrate in a polishing head against a polishing surface;
    magnetically biasing a conductive element against the substrate;
    flowing electrolyte to the substrate; and
    electrically biasing the conductive element.

22. The method of claim 21, wherein the step of magnetically biasing further comprises:
    attracting the conductive element to a magnetic element disposed within the polishing head.

23. The method of claim 22, wherein the step of attracting further comprises:

applying power to an electromagnet.

24. The method of claim 21, wherein the step of magnetically biasing further comprises:

magnetically repulsing the conductive element.

25. The method of claim 24, wherein the step of magnetically repulsing the conductive element further comprises:

applying power to an electromagnet disposed in a platen supporting the polishing surface.

26. A method for removing conductive material from a substrate, comprising:

retaining a substrate in a polishing head against a polishing surface;

applying power to an electromagnet disposed in the polishing head;

magnetically attracting a conductive element disposed in the polishing substrate to the electromagnet; and electrically biasing the conductive element.

27. A polishing apparatus, comprising:

a polishing pad having an upper surface adapted to support a substrate thereon during processing; and a conductive element disposed in the polishing pad and movable between a first position proximate the upper surface and a second position away from the upper surface, wherein the conductive element is magnetically biased towards the first position.

28. The polishing apparatus of claim 27, wherein the conductive element further comprises a plurality of rollers.

29. The polishing apparatus of claim 27, further comprising:

a polishing head disposed above the polishing pad;

a platen supporting the polishing pad; and a magnetic element disposed in at least one of the polishing head or the platen.

30. The polishing apparatus of claim 29, wherein the magnetic element is an electromagnet.

31. The polishing apparatus of claim 29, wherein the magnetic element is an permanent magnet.

32. A polishing apparatus comprising:

a polishing pad having an upper surface adapted to support a substrate thereon during processing; and a conductive element movably disposed in the polishing pad and magnetically biased towards the upper surface.

33. A method for removing conductive material from a substrate, comprising:

positioning the substrate on a polishing pad having an electrolyte disposed thereon;

magnetically biasing one or more conductive elements movably disposed in the pad into contact with the substrate; and applying a current to the substrate through the conductive elements.

34. The method of claim 33, wherein the step of magnetically biasing further comprises:

attracting the conductive element to a magnetic element disposed within the polishing head.

35. The method of claim 34, wherein the step of attracting further comprises:

applying power to an electromagnet.

36. The method of claim 33, wherein the step of magnetically biasing further comprises:

magnetically repulsing the conductive element.

37. The method of claim 36, wherein the step of magnetically repulsing the conductive element further comprises:

applying power to an electromagnet disposed in a platen supporting the polishing surface.

* * * * *

UNITED STATES PATENT AND TRADEMARK OFFICE
CERTIFICATE OF CORRECTION

PATENT NO. : 6,884,153 B2 Page 1 of 1
DATED : April 6, 2005
INVENTOR(S) : Antoine P. Manens and Paul D. Butterfield It is certified that error appears in the above-identified patent and that said Letters Patent is hereby corrected as shown below:

<u>Column 9,</u>
Line 56, replace "heed" with -- head --.

<u>Column 10,</u>
Line 27, replace "th" with -- the --.

Signed and Sealed this

Twenty-eighth Day of March, 2006

JON W. DUDAS
*Director of the United States Patent and Trademark Office*

UNITED STATES PATENT AND TRADEMARK OFFICE
CERTIFICATE OF CORRECTION

PATENT NO. : 6,884,153 B2  
DATED : April 26, 2005  
INVENTOR(S) : Antoine P. Manens and Paul D. Butterfield It is certified that error appears in the above-identified patent and that said Letters Patent is hereby corrected as shown below:

<u>Column 9,</u>  
Line 56, replace "heed" with -- head --.

<u>Column 10,</u>  
Line 27, replace "th" with -- the --.

This certificate supersedes Certificate of Correction issued March 28, 2006.

Signed and Sealed this

Second Day of May, 2006

JON W. DUDAS  
*Director of the United States Patent and Trademark Office*